US011270943B2

(12) United States Patent
Griggio et al.

(10) Patent No.: US 11,270,943 B2
(45) Date of Patent: Mar. 8, 2022

(54) COPPER INTERCONNECT CLADDING

(71) Applicant: INTEL CORPORATION, Santa Clara, CA (US)

(72) Inventors: Flavio Griggio, Portland, OR (US); Philip Yashar, Portland, OR (US); Anthony V. Mule, Portland, OR (US); Gopinath Trichy, Portland, OR (US); Gokul Malyavanatham, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 832 days.

(21) Appl. No.: 15/937,527

(22) Filed: Mar. 27, 2018

(65) Prior Publication Data

US 2019/0304918 A1 Oct. 3, 2019

(51) Int. Cl.
| | | |
|---|---|---|
| *H01L 23/532* | (2006.01) | |
| *H01L 21/768* | (2006.01) | |
| *H01L 21/02* | (2006.01) | |
| *H01L 23/522* | (2006.01) | |
| *H01L 23/528* | (2006.01) | |
| *H01L 27/02* | (2006.01) | |

(52) U.S. Cl.
CPC .. *H01L 23/53238* (2013.01); *H01L 21/02362* (2013.01); *H01L 21/76852* (2013.01); *H01L 23/5226* (2013.01); *H01L 23/5283* (2013.01); *H01L 23/5329* (2013.01); *H01L 27/0203* (2013.01)

(58) Field of Classification Search
CPC ......... H01L 23/53238; H01L 21/76852; H01L 21/02362; H01L 21/76849; H01L 23/5329; H01L 27/0203; H01L 23/5226; H01L 21/76843; H01L 21/76858
See application file for complete search history.

(56) References Cited

U.S. PATENT DOCUMENTS

| | | | |
|---|---|---|---|
| 6,084,302 A | 7/2000 | Sandhu | |
| 8,044,519 B2 * | 10/2011 | Watanabe | ......... H01L 21/76846 257/774 |
| 9,711,400 B1 * | 7/2017 | Yang | .................... H01L 23/5226 |
| 2019/0311992 A1 * | 10/2019 | Bark | .................... H01L 23/5283 |

OTHER PUBLICATIONS

U.S. Appl. No. 16/141,522, filed Sep. 25, 2018, 26 pages.

* cited by examiner

*Primary Examiner* — Sonya McCall-Shepard
(74) *Attorney, Agent, or Firm* — Schwabe, Williamson & Wyatt, P.C.

(57) ABSTRACT

An integrated circuit includes: a front end of line (FEOL) circuit including a transistor; and a back end of line circuit above the FEOL circuit and including insulator material having an interconnect feature therein. The interconnect feature includes: a core including copper; a first layer between the insulator material and the core, the first layer being distinct from the core; a second layer between the first layer and the core, the second layer being distinct from the first layer and the core, the second layer including a first metal and a second metal different from the first metal; and a capping member on the core and the second layer, the capping member including the second metal. In an embodiment, the first metal and the second metal are part of a solid solution in the second layer. In an embodiment, the first metal is ruthenium and the second metal is cobalt.

16 Claims, 17 Drawing Sheets

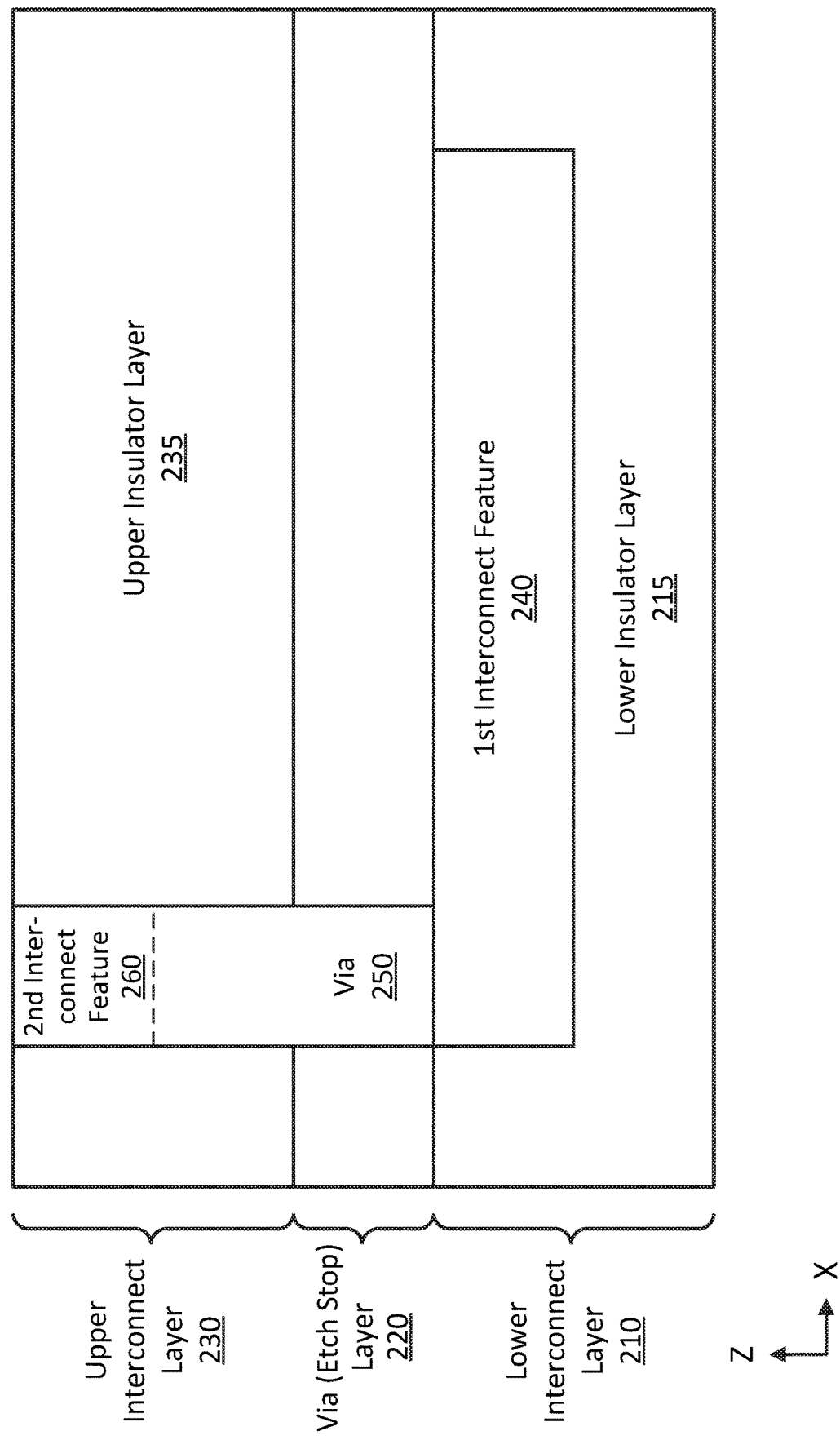

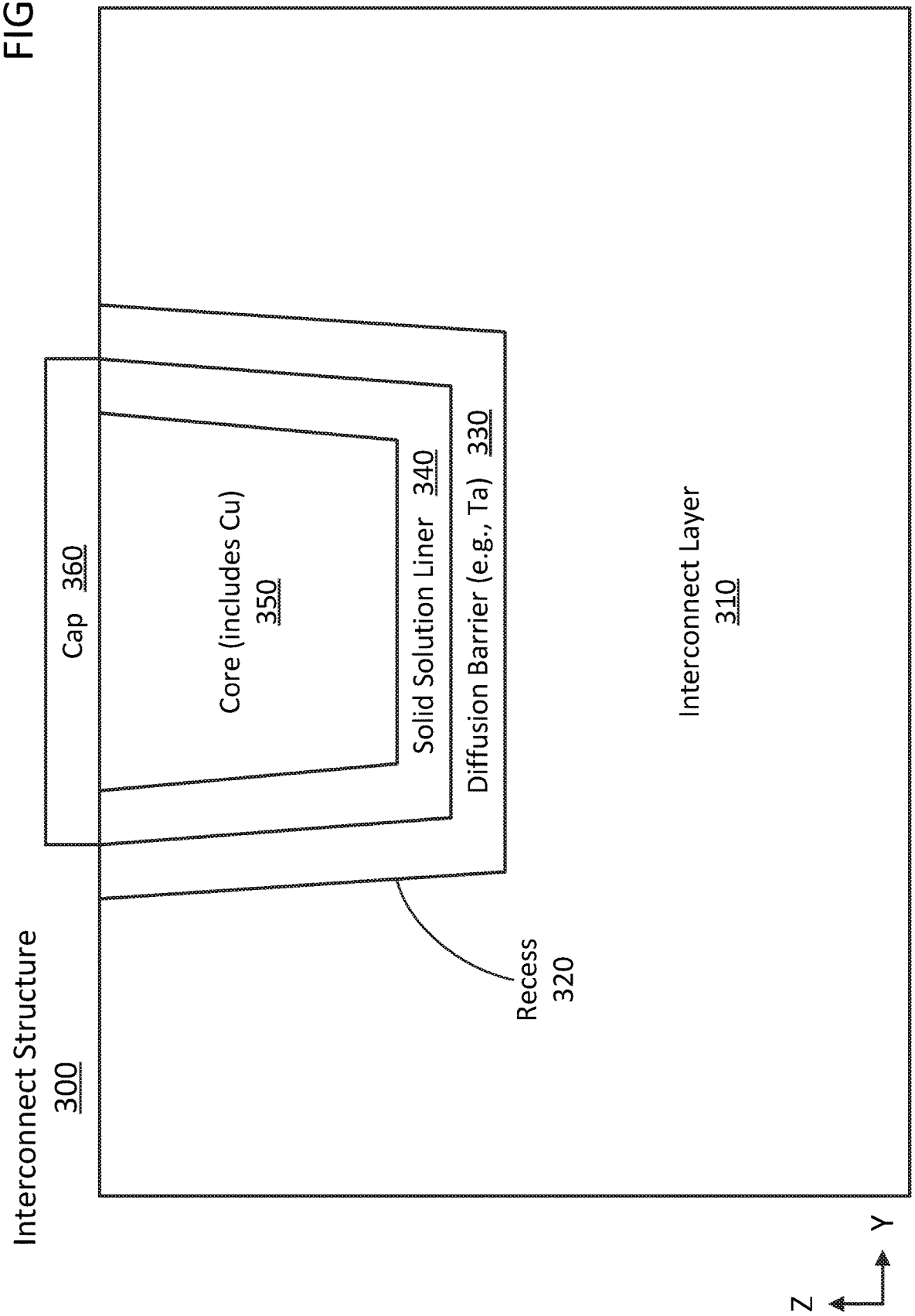

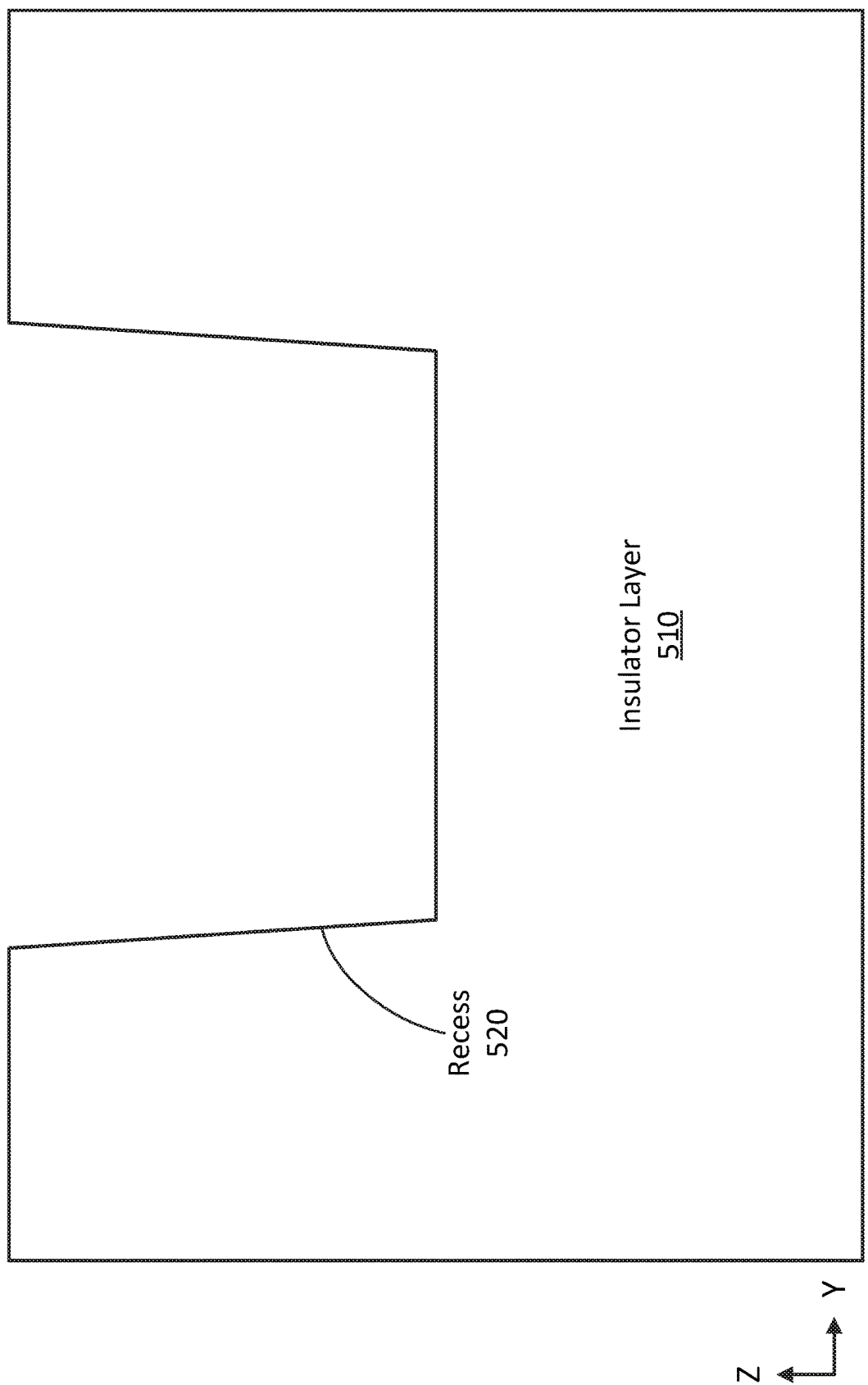

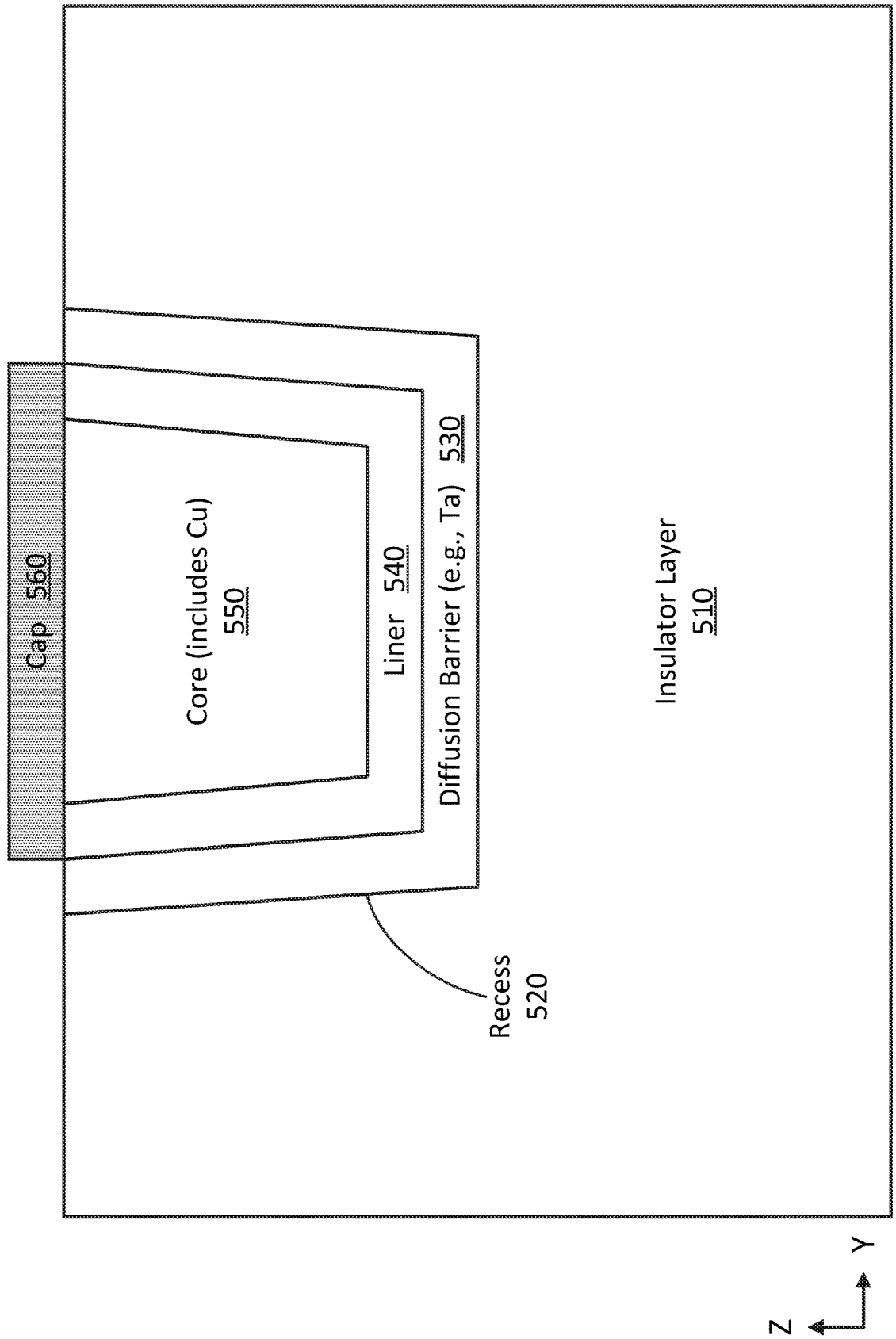

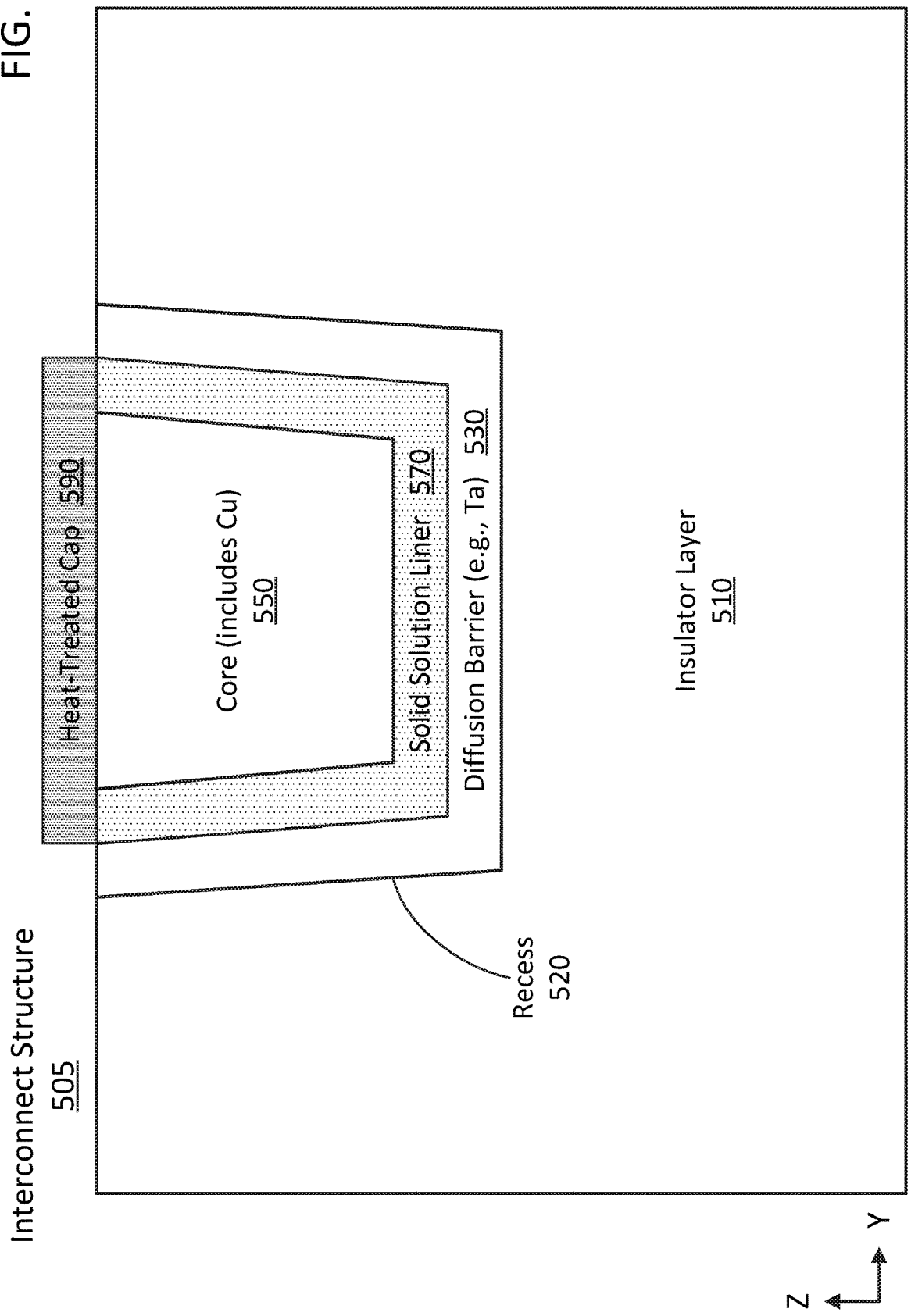

COPPER INTERCONNECT CLADDING

BACKGROUND

Because of attractive features such as its low resistance and high electrical conductance, copper is frequently used for interconnecting signals between separated devices in integrated circuits (ICs). However, there are a number of non-trivial performance issues associated with the scaling of copper interconnect to smaller technology nodes and feature sizes.

BRIEF DESCRIPTION OF THE DRAWINGS

FIGS. 2A-2B are cross-sectional and plan views, respectively, of example interconnect features in an IC structure, according to embodiments of the present disclosure.

FIG. 3 is a cross-sectional view of an example interconnect structure, according to an embodiment of the present disclosure.

FIGS. 5A-5G and 5G' are cross-sectional views of example methods of forming interconnect structures, according to embodiments of the present disclosure.

Figure 1:
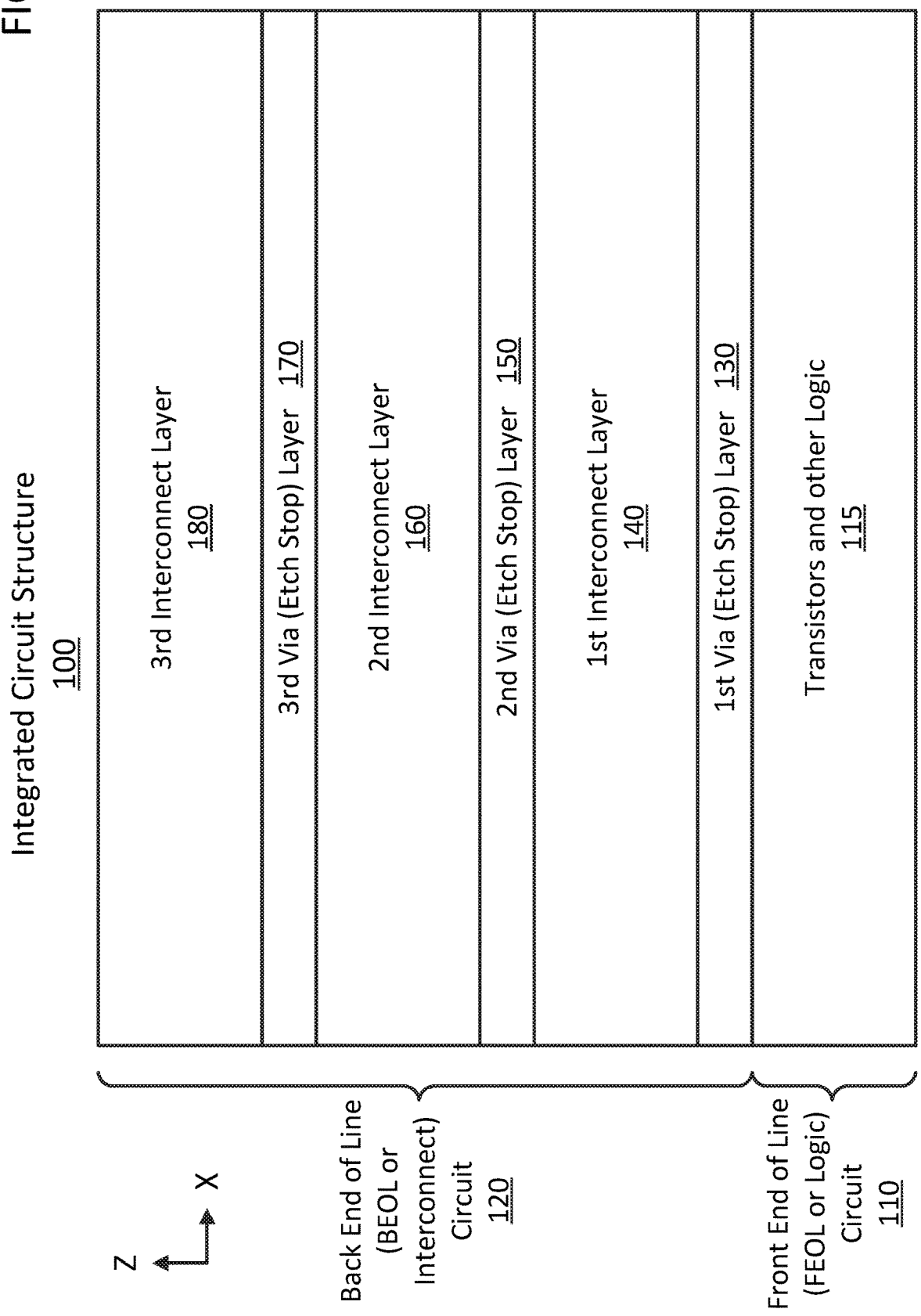
FIG. 1 is a cross-sectional view of an example integrated circuit (IC) structure, according to an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

This disclosure proposes techniques of copper interconnect cladding to improve the interface adhesion of copper to all the walls in the metal interconnect lines of integrated circuit (IC) structures. This can result, for example, in improved electromigration (EM) performance, increased margin for current densities, and little to no resistance penalty. Proposed techniques include using two or more metals (such as transition metals) that satisfy the Hume-Rothery rules for substitutional solid solutions. One such metal (such as a noble metal) is used for a conformal liner (e.g., an adhesion/wetting layer, for better gap fill with the copper), while the other is used as a selective deposition cap (e.g., to bond with the copper and reduce or prevent EM performance degradation on the top surface of the copper core). The thermal budget of a later process, such as forming a nitride etch stop layer, can then be used to heat the liner and the cap, and to diffuse the cap metal into the liner metal and create a solid solution of the two metals. This diffusion could also be caused by a dedicated heat-based diffusion process, as will be appreciated. The diffusion of the cap metal into the liner metal effectively at least partially if not fully clads the copper core with the cap metal, to reduce or minimize any EM performance degradation.

General Overview

As noted above, there are a number of non-trivial performance issues associated with the scaling of copper interconnect to smaller technology nodes and feature sizes. For instance, the scaling of copper interconnect presents challenges for gap fill as well as increased demands for electromigration (EM) performance. Existing copper interconnect gap fill techniques for feature sizes below 80 nanometers (nm) pitch suffer from excessive EM in long interconnect lines. This is especially problematic for design rule constraints and electric current requirements for technology nodes such as 14 nm, 10 nm, and beyond. Existing gap fill techniques can also suffer from increased EM performance degradation due to poor adhesion of copper to the top nitride etch stop layer.

Accordingly, this disclosure proposes techniques of copper interconnect cladding to reduce or minimize EM effects and extend copper interconnect lines, vias, and other features into newer IC technology nodes. In an embodiment, an ultrathin noble metal (like ruthenium) adhesion/wetting layer or so-called liner is inserted into the metallization stack for forming the interconnect lines, vias, and other features. For example, this allows pure copper seed to be used on the noble metal (which provides good adhesion for the copper) when electroplating the copper core to form the interconnect features (such as with a Damascene or dual Damascene (DD) process), in some such embodiments. The pure copper core, in turn, reduces interconnect line resistance that can result from using a copper alloy to form the interconnect line. According to various embodiments, a good bonding metal for copper, such as a metal (like cobalt) that reduces or minimizes EM effects of copper that is clad by such a metal, is used to form a thin cap on the copper core and possibly on the noble metal liner (e.g., by selective deposition). In various embodiments, heat treatment follows this metal cap formation, to diffuse the cap metal into the metal liner to effectively clad the copper core with the cap metal. The depth of the diffusion of the cap metal into the liner metal may vary from one embodiment to the next, but in some example such cases the cap metal fully surrounds the copper core. In such cases, note that the cap metal and the liner metal effectively blend together within the liner to collectively surround or clad the copper core.

In some embodiments, the liner and cap metals are chosen from two or more transition metals that satisfy the Hume-Rothery rules for substitutional solid solutions, to form a complete solid solution in the liner with the cap metal. For example, the liner and cap metals can have the same crystal structure, such as molybdenum, tantalum, and tungsten (for body centered cubic metals), or rhodium, palladium, platinum, and gold (for face centered cubic metals), or scandium, titanium, cobalt, technetium, ruthenium, cadmium, rhenium, and osmium (for hexagonal close-packed metals). In some embodiments, the liner metal is a noble metal, such as one or more of ruthenium (Ru), rhodium (Rh), palladium (Pd), osmium (Os), platinum (Pt), and gold (Au). In some embodiments, the metal liner is preceded by a diffusion barrier, such as tantalum or a tantalum alloy, to reduce or prevent later-formed metals (such as copper) of the interconnect feature from diffusing into an underlying layer or substrate (such as an insulation layer in which the interconnect feature is formed). In some embodiments, the liner metal also diffuses into the metal cap.

According to an example embodiment, an integrated circuit (IC) structure is provided. The IC structure includes a front end of line (FEOL) circuit including one or more transistors, and a back end of line (BEOL) circuit above the FEOL circuit and including insulator material and an interconnect feature. At least a portion of the interconnect feature is in the insulator material. The interconnect feature includes a core containing copper, and a first layer (such as a diffusion barrier including tantalum) between the insulator material and the core. The interconnect feature further includes a second layer (such as a metal liner) between the first layer and the core, where the second layer is distinct from the first layer and the core. The second layer includes a first metal (such as a noble metal) and a second metal different from the first metal (such as another metal having the same crystal structure as the first metal). The interconnect feature further includes a capping member on the core and the second layer, where the capping member includes the second metal.

In some embodiments, the BEOL circuit further includes a nitride etch stop layer on and contacting the capping member. In some embodiments, the first metal and the second metal are part of a solid solution in the second layer, where the first and second metals include two transition metals that satisfy the Hume-Rothery rules for substitutional solid solutions. In some embodiments, the second metal of the capping member is diffused into the first metal of the second layer, such that the second layer includes a solid solution that contains the first metal and the second metal. In some embodiments, the first metal is ruthenium and the second metal is cobalt.

Numerous other example embodiments and configurations will be apparent in light of this disclosure.

System Architecture

FIG. 1 is a cross-sectional view of an example integrated circuit (IC) structure, according to an embodiment of the present disclosure. Here, X, Y, and Z represent orthogonal dimensions (such as length, width, and height, with the X and Y dimensions being planar or horizontal dimensions and the Z dimension being the vertical dimension). For example, in a metal interconnect structure, such as a back end of line (BEOL) circuit, there are multiple interconnect layers for routing metal interconnect lines. Each layer can be devoted, for example, to routing the interconnect primarily in one direction, such as the X-direction or the Y-direction. For instance, one interconnect layer (a lower interconnect layer) can route interconnection lines in the X-direction, while the next higher interconnect layer (an upper interconnect layer) can route interconnection lines in the Y-direction. In addition, an etch stop (or via) layer is between vertically adjacent interconnect layers to electrically connect interconnect lines in the lower interconnect layer to appropriate or corresponding interconnect lines in the upper interconnect layer. For example, the etch stop layer can include a nitride material (such as silicon nitride), with vias or other interconnect features at selected portions in the etch stop material to electrically connect the interconnect lines or other IC structures of different interconnect lines.

Referring to FIG. 1, the IC structure 100 includes a front end of line (FEOL) circuit 110. The FEOL circuit 110 can include, for example, transistors 115 (and other electrical devices, such as diodes, resistors, and the like) on a substrate. The IC structure 100 further includes a BEOL circuit 120 on the FEOL circuit, to interconnect the signals of the transistors 115 (and other circuits). The IC structure 100 can be fabricated using IC fabrication techniques such as photolithography. The BEOL circuit 120 is shown with three interconnect layers, namely a first interconnect layer 140, a second interconnect layer 160, and a third interconnect layer 180, with a first via (or etch stop) layer 130 separating the first interconnect layer 140 from the FEOL circuit 110, a second via (or etch stop) layer 150 separating the second interconnect layer 160 from the first interconnect layer 140, and a third via (or etch stop) layer separating the third interconnect layer 180 from the second interconnect layer 170. While three interconnect layers are shown in the IC structure of FIG. 1, in other embodiments, there can be as many interconnect layers as needed to perform the corresponding interconnections and stay within any technological design constraints.

Figure 2B:
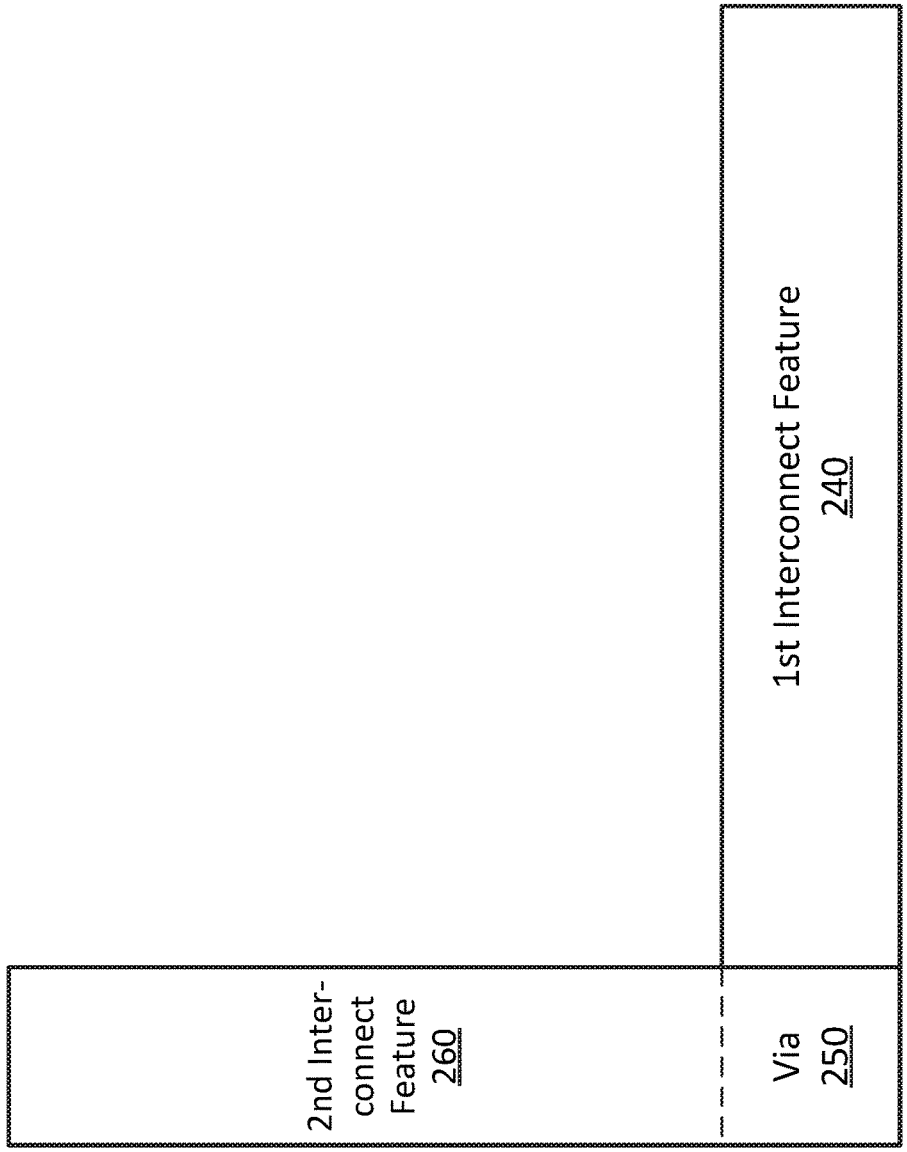

FIGS. 2A-2B are cross-sectional (X-Z) and plan (X-Y) views, respectively, of example interconnect features 240, 250, and 260 in an IC structure 200, according to embodiments of the present disclosure. The IC structure 200 includes a lower interconnect layer 210, an upper interconnect layer 230, and a via (or etch stop) layer 220 between the lower interconnect layer 210 and the upper interconnect layer 230. The lower interconnect layer 210 includes a lower insulator layer 215 in which is formed a first interconnect feature 240 (such as an interconnect line extending in the X-direction). The upper interconnect layer 230 includes an upper insulator layer 235 in which is formed a second interconnect feature 260 (such as an interconnect line extending in the Y-direction). The via layer 220 includes an etch stop material (such as a nitride like silicon nitride) in which is formed a via 250 (such as an interconnect via extending in the Z-direction) electrically connecting the first interconnect feature 240 and the second interconnect feature 260. The IC structure 200 can be fabricated using IC fabrication techniques such as photolithography.

The lower insulator layer 215 and the upper insulator layer 235 contain an insulator material, such as an oxide or nitride like silicon dioxide. Each of the first interconnect feature 240, the via 250, and the second interconnect feature 260 (all of which will generally be referred to as interconnect features) is a conductive material such as metal or a metal stack of one or more layers using one or more metals or metal alloys, compounds, or solid solutions. The metal layers can be on one or more (cross-sectional) sides of the interconnect feature, including fully cladding the interconnect feature. The features include a core material containing a conductive metal such as copper. While the first interconnect feature 240, the via 250, and the second interconnect feature 260 are identified as three separate (and adjacent) features, they can be one or more contiguous structures in different embodiments (such as an X-direction connection line like the first interconnect feature 240, a Y-direction connection line like the second interconnect feature 260, and a Z-direction via such as the via 250). For example, as illustrated in FIGS. 2A-2B, the first interconnect feature 240 is separate (such as fully clad) but contiguous with the via 250, which can share a copper core and cladding with the second interconnect feature 260.

FIG. 3 is a cross-sectional (Y-Z) view of an example interconnect structure 300 (such as an interconnect line extending in the X-direction), according to an embodiment of the present disclosure. The interconnect structure 300 includes interconnect layer 310, such as an insulator layer in which an interconnect feature (e.g., interconnect line) is formed in a recess 320 of the insulator layer. The recess is lined with a diffusion barrier 330 (such as tantalum or an alloy containing tantalum). The diffusion barrier 330 reduces or prevents unintended diffusion of interconnect metal (such as copper) into the insulator layer and other structures. The diffusion barrier 330 is lined with a solid solution liner 340 including two or more metals (such as transition metals) that satisfy the Hume-Rothery rules for substitutional solid solutions. For example, the two or more metals can have the same crystal structure. Example such metals include two or more body centered cubic metals such as molybdenum (Mo), tantalum (Ta), and tungsten (W), two or more face centered cubic metals such as rhodium (Rh), palladium (Pd), platinum (Pt), and gold (Au), or two or more hexagonal close-packed metals such as scandium (Sc), titanium (Ti), cobalt (Co), technetium (Tc), ruthenium (Ru), cadmium (Cd), rhenium (Re), and osmium (Os).

One of the metals (a first metal) can be, for example, a good adhesion/wetting metal (such as a noble metal) for lining the diffusion barrier 330 and creating a good base metal for seeding copper (e.g., pure copper) for later electroplating and creation of a copper core. Example such noble metals (first metals) include ruthenium (Ru), rhodium (Rh), palladium (Pd), osmium (Os), platinum (Pt), and gold (Au). Another of the metals (a second metal) in the solid solution liner 340 can be a metal (such as cobalt) that bonds well with copper and helps reduce or prevent electromigration (EM) performance degradation of the copper interconnect line.

The solid-solution lined recess 320 is filled with a core 350, such as a metal core including copper. For example, the copper can be electroplated as part of a Damascene or dual Damascene (DD) process. The core 350 and the solid solution liner 340 is capped with a cap 360, where the cap 360 includes the second metal (such as cobalt). In some embodiments, the second metal has a higher concentration in the cap 360 than in the solid solution liner 340. In some embodiments, the first metal is part of the cap 360. In some such embodiments, the first metal has a higher concentration in the solid solution liner 340 than in the cap 360. In some embodiments, the interconnect structure 300 is covered with a nitride etch stop layer (such as silicon nitride). The interconnect structure 300 can be fabricated, for example, using IC techniques such as photolithography and dual Damascene.

Figure 4:
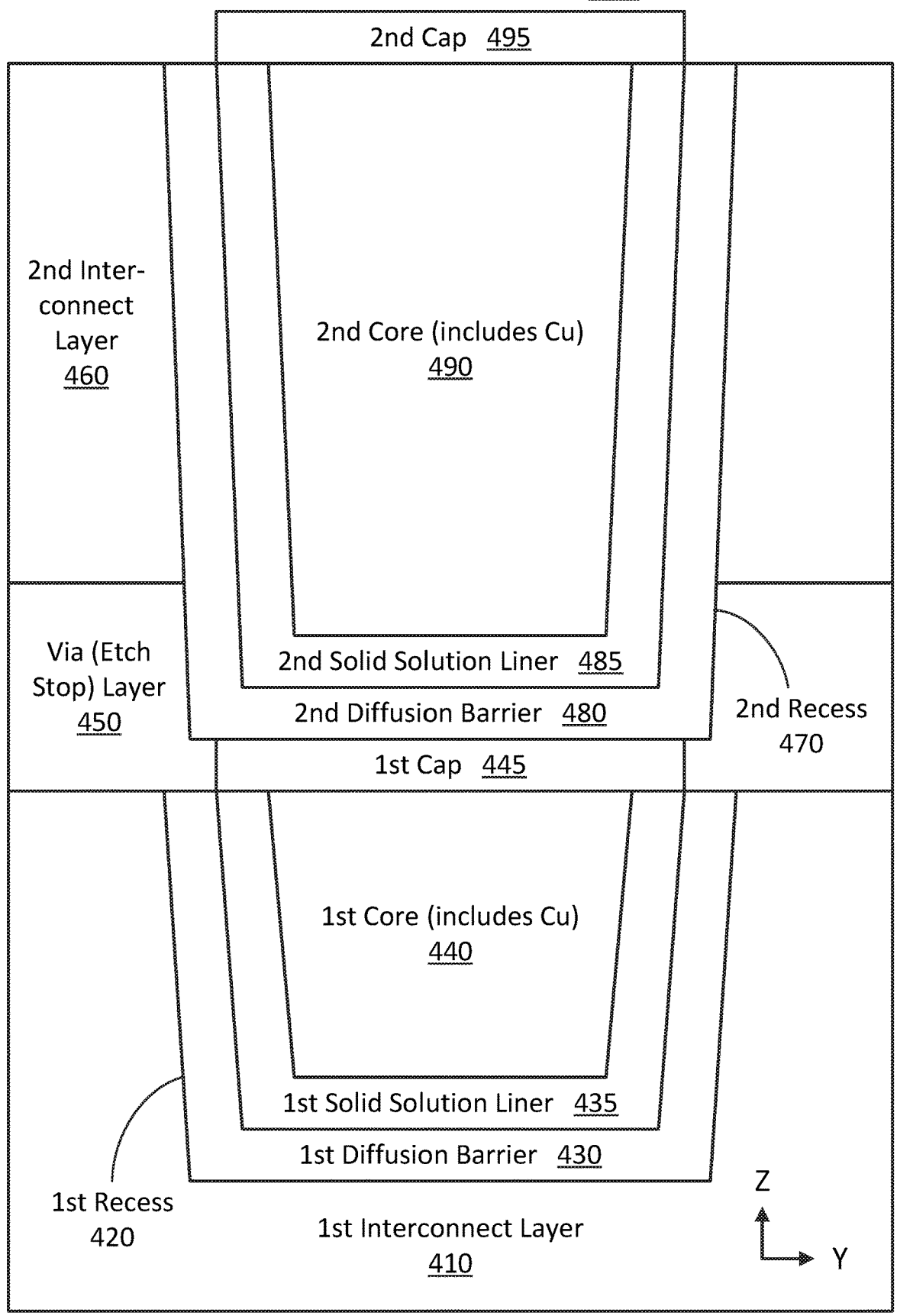
FIG. 4 is a cross-sectional view of an example interconnect structure, according to another embodiment of the present disclosure.

FIG. 4 is a cross-sectional (Y-Z) view of an example interconnect structure 400, according to another embodiment of the present disclosure. The interconnect structure 400 of FIG. 4 shares many similarly named (and similarly described) components to the interconnect structure 300 of FIG. 3. Accordingly, the description of the interconnect structure 400 of FIG. 4 will focus primarily on the differences with the interconnect structure 300 of FIG. 3, and description of similarly named components may not be repeated.

Referring to FIG. 4, the interconnect structure 400 includes first interconnect layer 410, second interconnect layer 460, and via (or etch stop) layer 450 between the first interconnect layer 410 and the second interconnect layer 460. In addition, the interconnect structure 400 includes an interconnect feature (a lower interconnect feature) formed primarily in the first interconnect layer 410, and another interconnect feature (an upper interconnect feature) formed primarily in the via layer 450 and the second interconnect layer 460. The lower interconnect feature is formed in a first recess 420 of an insulator layer of the first interconnect layer 410, and includes a first diffusion barrier 430, a first solid solution liner 435, a first core 440, and a first cap 445 (similar to the diffusion barrier 330, solid solution liner 340, core 350, and cap 360 of the interconnect structure 300 of FIG. 3).

A nitride etch stop layer 450 is formed on the first cap 445, and a second interconnect layer 460 is formed on the etch stop layer 450. A second recess 470 is formed in the second interconnect layer 460 and the etch stop layer 450 to coincide with and expose the first cap 445 (such as by a self-aligned via process). The second diffusion barrier 480 lines the second recess 470 and promotes an electrical connection with the first cap 445 (and, by extension, between the lower interconnect feature and the upper interconnect feature). The upper interconnect feature also includes a second solid solution liner 485, a second core 490, and a second cap 495 (similar to the solid solution liner 340, core 350, and cap 360 of the interconnect structure 300 of FIG. 3). The interconnect structure 400 of FIG. 4 can be fabricated similar to the interconnect structure 300 of FIG. 3, along with a self-aligned via process to align the upper interconnect feature with the lower interconnect feature.

FIGS. 5A-5G and 5G' are cross-sectional (Y-Z) views of example methods of forming interconnect structures 500 and 505, according to embodiments of the present disclosure. The operations of these methods can be performed using IC techniques such as photolithography.

Figure 5A:
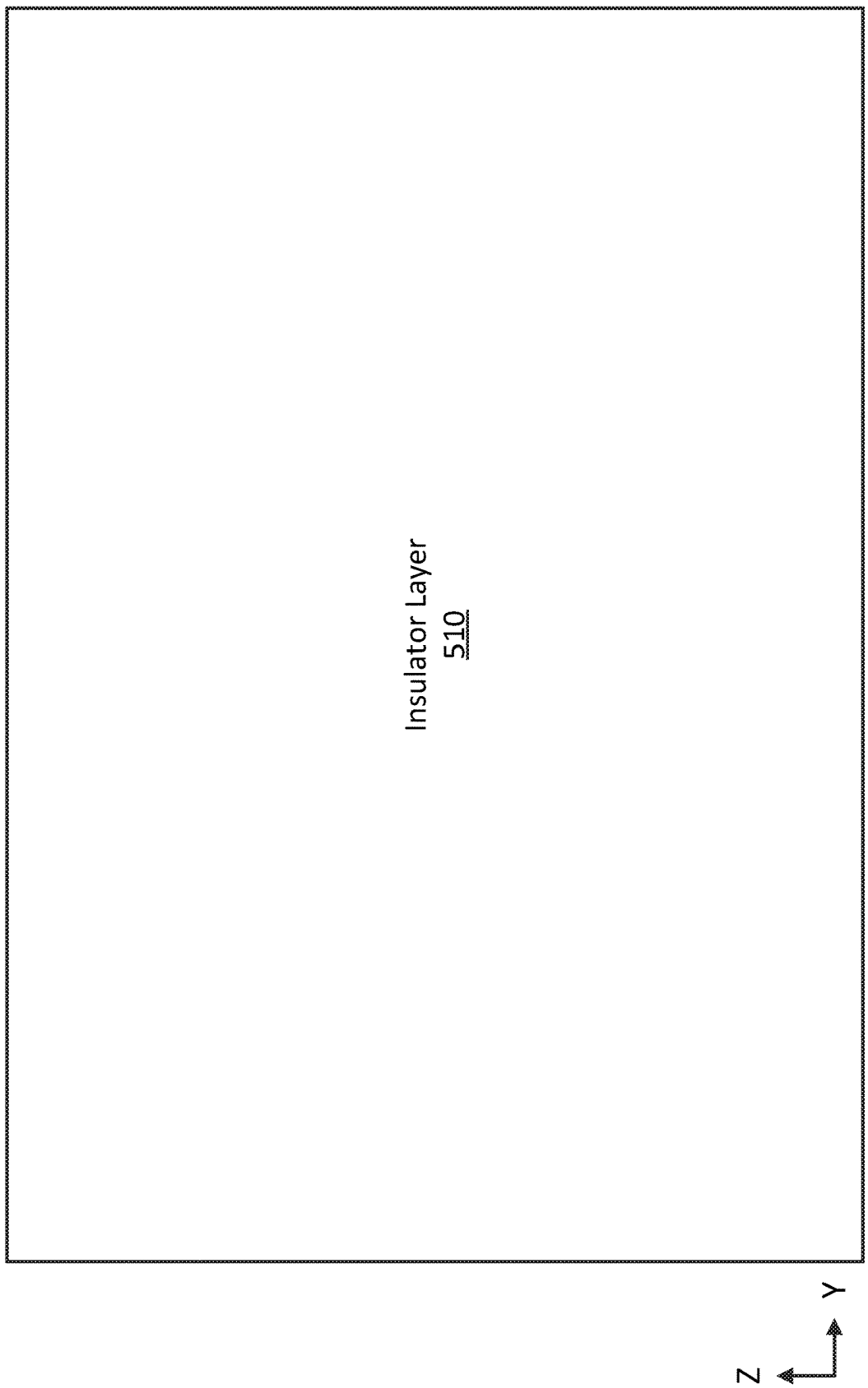
Figure 5C:
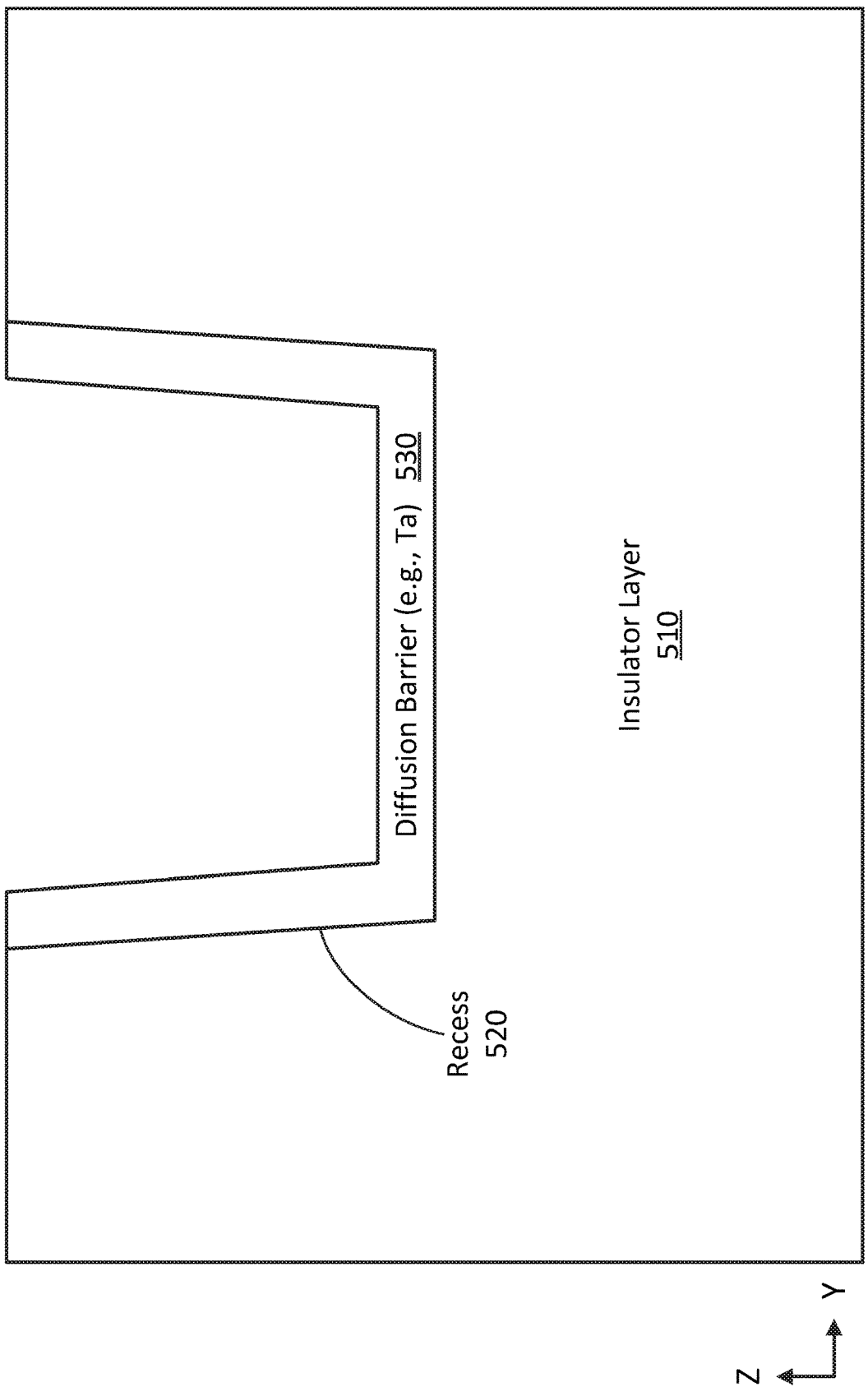
Figure 5D:
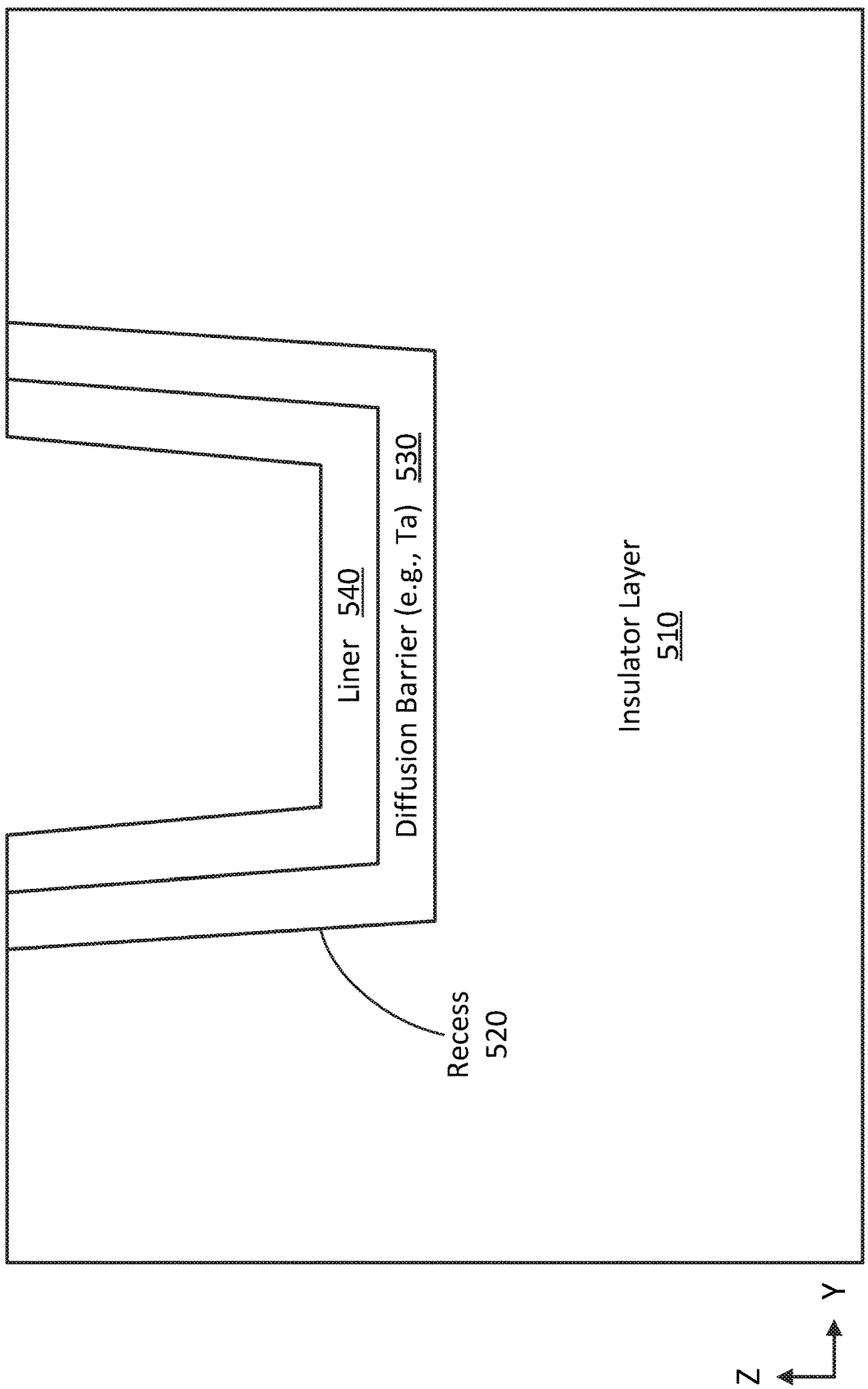

Processing begins with FIG. 5A, an insulator layer 510 of an interconnect layer is formed (such as deposited). The insulator layer 510 can be an oxide or nitride, such as silicon dioxide. In FIG. 5B, a recess 520 is formed (e.g., etched) in the insulator layer. The recess 520 is used to route an interconnect feature (such as an interconnect line). In FIG. 5C, a diffusion barrier 530 is formed (e.g., deposited) in the recess 520. The diffusion barrier 530 helps prevent or reduce metal (such as copper) diffusion or contamination into unintended areas, such as in the insulator layer 510. The diffusion barrier 530 also promotes conduction of the interconnect line. In FIG. 5D, a metal conformal liner 540 is formed (such as deposited) in the diffusion-barrier lined recess 520. The conformal liner 540 can include, for example, a noble metal (such as ruthenium) or other adhesion/wetting metal (e.g., for tantalum and copper). The liner 540 can be very thin, such as a few nanometers (nm) thick (e.g., 2 nm, 3 nm, or 5 nm).

Figure 5E:
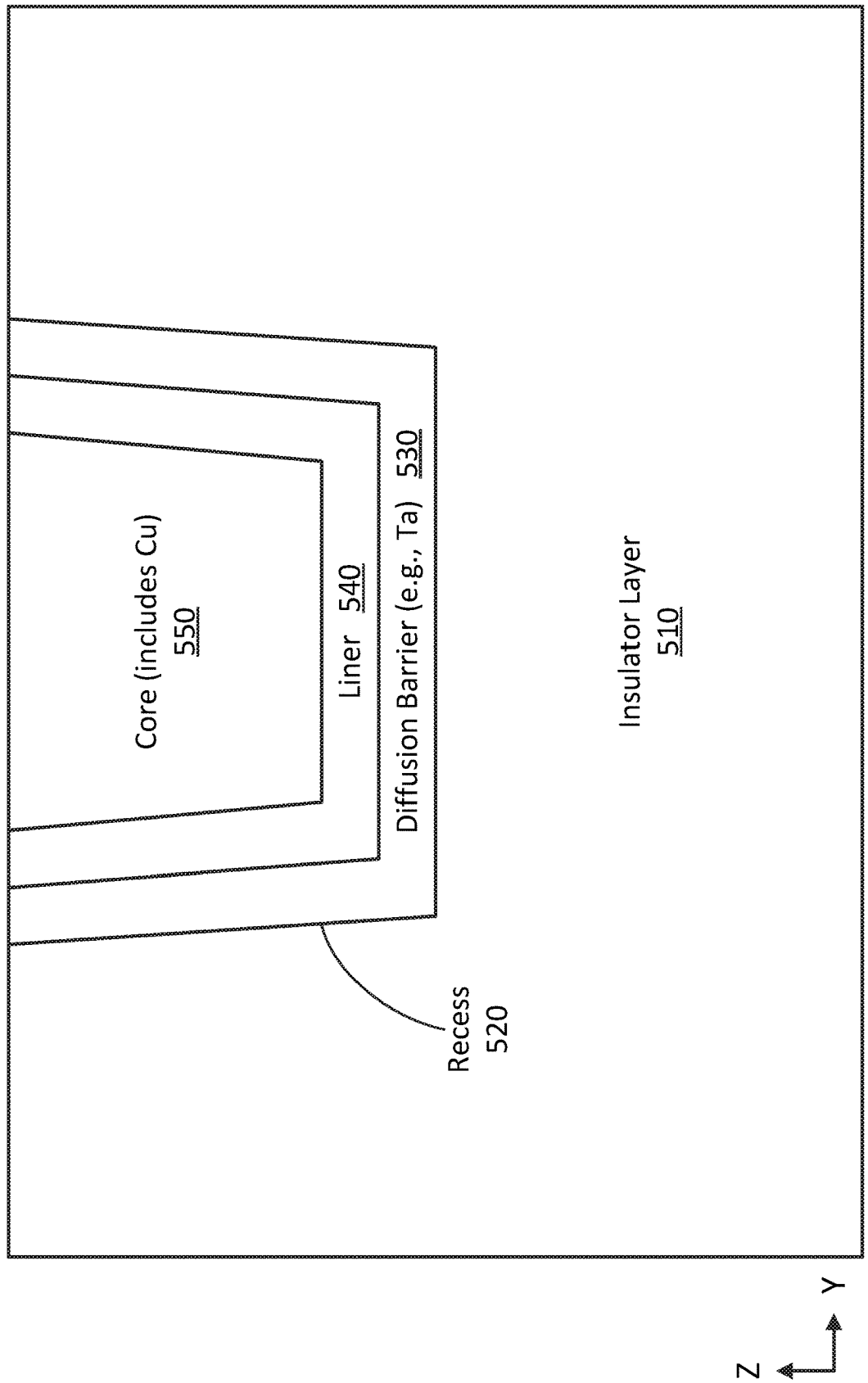

In FIG. 5E, the remainder of the noble-metal lined recess 520 is filled with a copper core 550, such as with a Damascene process. For example, a seed copper layer (such as pure copper) can be formed (e.g., deposited) on the conformal liner 540, and electroplating used to fill the recess 520 with copper. Excess copper can be removed, for example, with chemical-mechanical planarization or polishing (CMP) to produce a planarized copper core 550. In FIG. 5F, a metal cap 560 is formed (such as deposited) on the core 550 and possibly on the liner 540. By way of example the metal cap 560 can include capping material (such as cobalt) that bonds well with the copper in the core 550 and helps clad the core 550 and reduce or minimize electromigration (EM) performance degradation. In some embodiments, the cap metal and the liner metal include two or more metals (such as transition metals) that satisfy the Hume-Rothery rules for substitutional solid solutions. In some embodiments, the cap 560 is selectively deposited on the core 550. In some such embodiments, the cap is further selectively deposited on the liner 540.

Figure 5G:
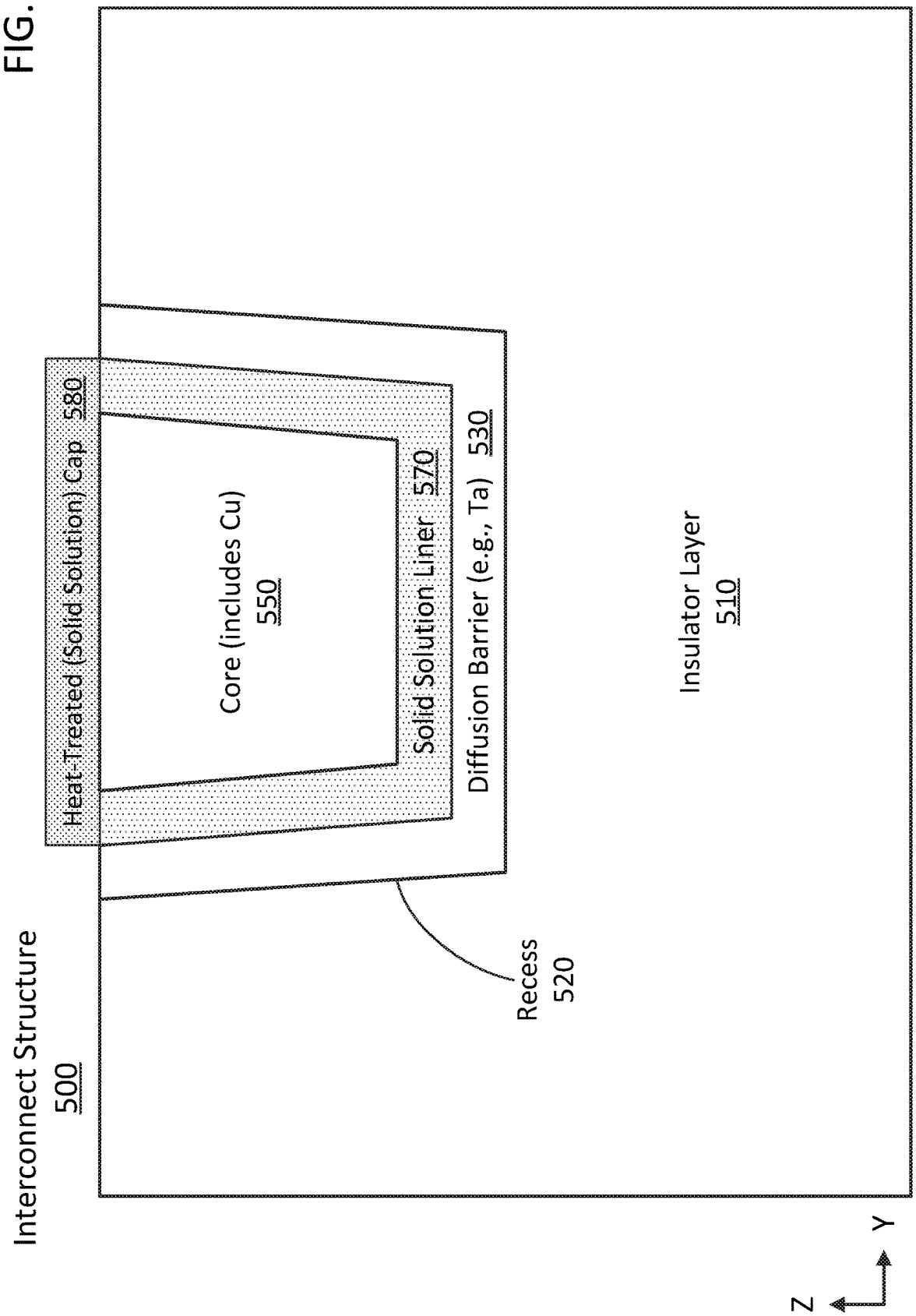

In FIG. 5G, the structure is heat treated or annealed (for example, as part of the thermal budget of later process steps, such as forming a nitride etch stop layer on the cap 560) to create the interconnect structure 500. The heat treatment causes the metal in the cap 560 (e.g., cobalt) to diffuse into the metal in the liner 540 (e.g., ruthenium) and create a solid solution 570 of the two metals in place of the original liner 540. As a result, the cap metal is diffused into the solid solution liner 570 to fully clad the copper in the core 550. In addition, some of the liner metal may diffuse into the cap 560 to create a heat-treated (or even a solid solution) cap 580 containing both the cap metal and the liner metal. The concentration of the cap metal in the heat-treated cap 580 is greater than that in the solid solution liner 570. Further, the concentration of the liner metal in the solid solution liner 570 is greater than that in the heat-treated cap 580.

In an alternate embodiment, in FIG. 5G', the heat treatment leaves the liner metal predominantly in the solid solution liner 570, resulting in an interconnect structure 505 with a heat-treated cap 590 that is all or mostly the cap metal. The cap metal in the interconnect structure 505 still diffuses into the liner 540 to create the solid solution liner 570 of the liner metal and the cap metal.

Figure 6:
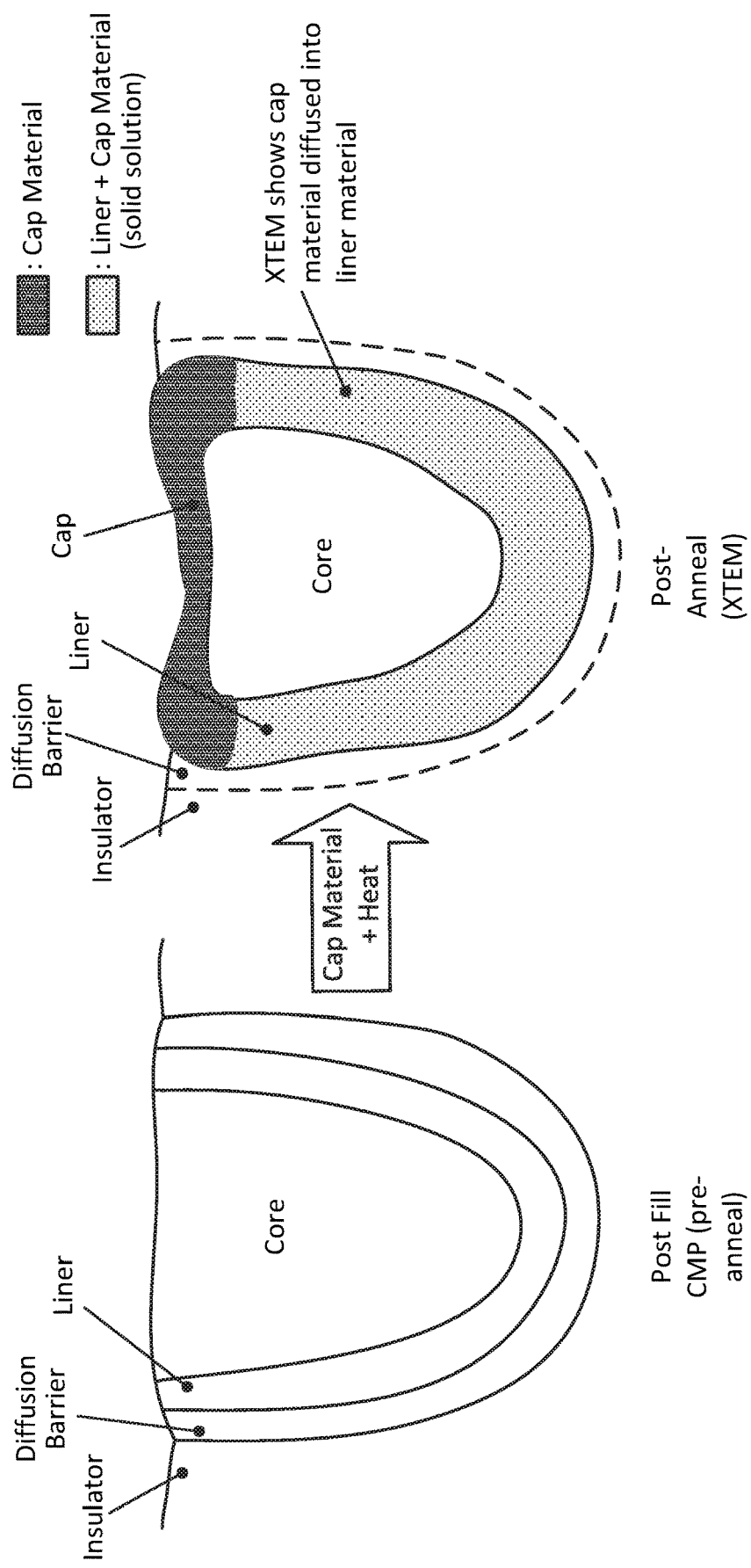
FIG. 6 is an illustration of cross-sectional transmission electron microscopy (XTEM) renditions of example interconnect structures, according to embodiments of the present disclosure.

FIG. 6 is an illustration of cross-sectional transmission electron microscopy (XTEM) renditions of example interconnect structures, according to embodiments of the present disclosure. In the illustration on the left, the core metal (e.g., copper) has filled the remainder of the insulator recess, which has been lined with a diffusion barrier (e.g., tantalum or tantalum nitride) and a metal liner (e.g., ruthenium). The structure has also been polished (e.g., through CMP). In the illustration on the right, after the deposition of the cap material (e.g., cobalt) and the heat treatment, the cap material has diffused into the liner to create the solid solution of the liner material and the cap material. Note that a state of equilibrium can be reached, depending on factors such as the temperature and duration of the heat treatment, where each of the liner and cap appear to be a solid solution material (and perhaps a similar or the same solid solution material) that includes both the liner and cap metals. To this end, the depiction on the right shows an alternate state where the cap has diffused into the liner but little to none of the liner has diffused into the cap. In other embodiments, the liner may diffuse into the cap to make the cap and liner look more alike. Numerous such variations and degrees of one-way diffusion and bi-directional diffusion will be apparent in light of this disclosure.

Methodology

Figure 7:
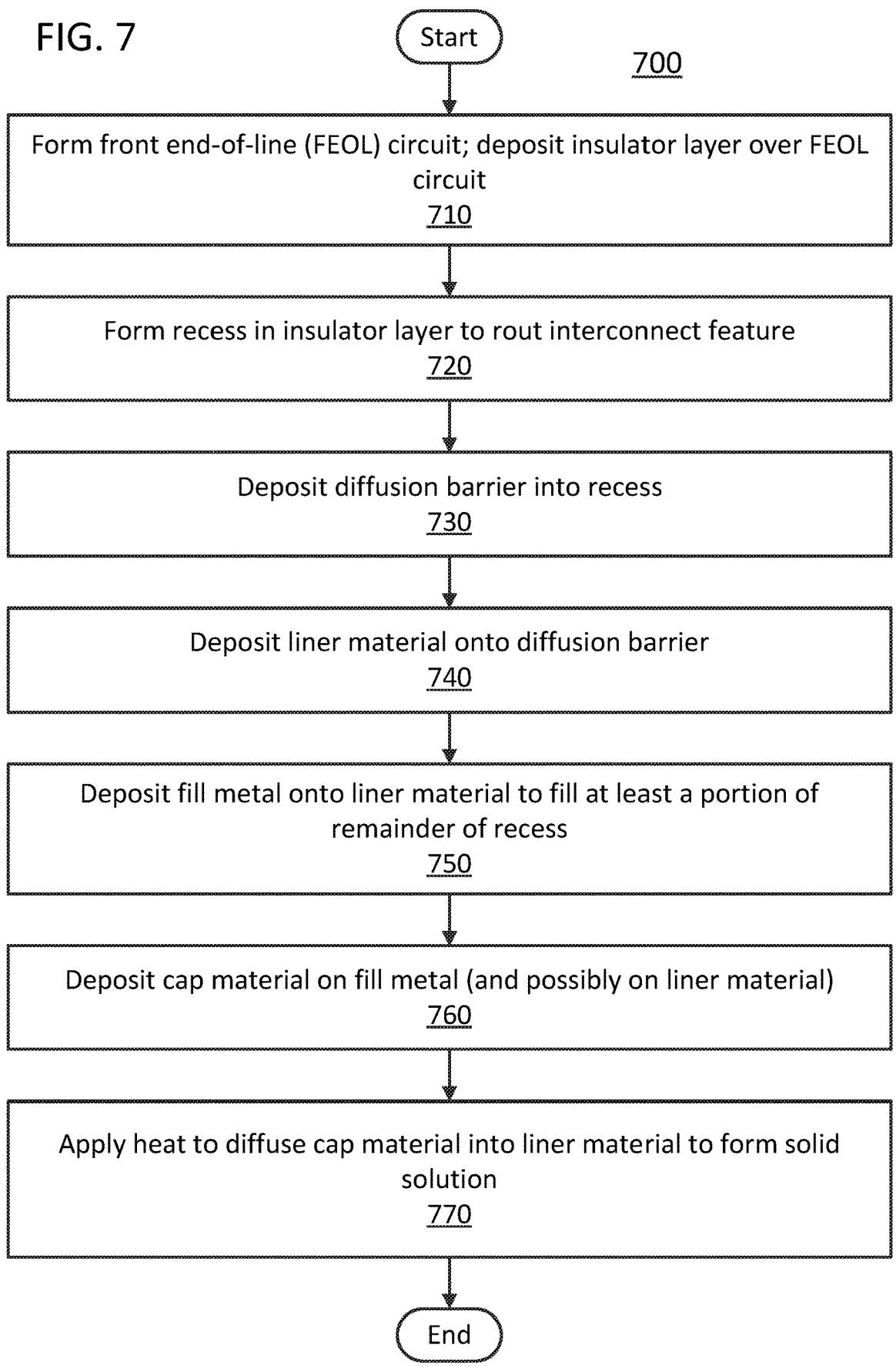
FIGS. 7-8 are flow diagrams of example methods of fabricating interconnect features in integrated circuits (ICs), according to embodiments of the present disclosure.
Figure 8:
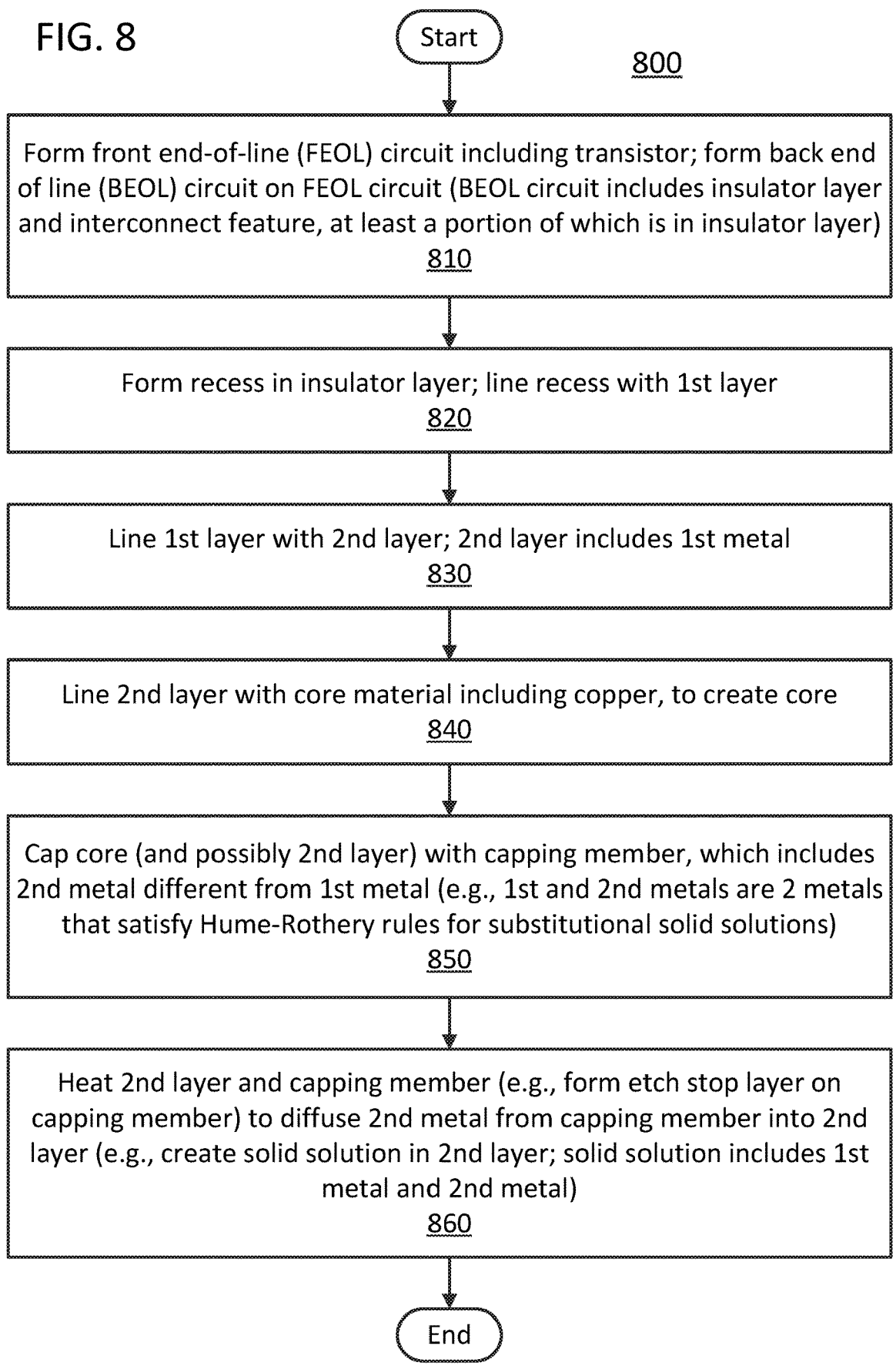

FIGS. 7-8 are flow diagrams of example methods 700-800 of fabricating interconnect features in integrated circuits (ICs), according to embodiments of the present disclosure. These and other methods disclosed herein may be carried out using IC fabrication techniques such as photolithography as would be apparent in light of the present disclosure. The corresponding transistors, interconnect features, and other devices and circuits may be part of other (logic) devices on the same substrate, such as application specific integrated circuits (ASICs), microprocessors, central processing units, processing cores, and the like. Unless otherwise described herein, verbs such as "coupled" or "couple" refer to an electrical coupling (such as capable of transmitting an electrical signal, or electrically conductive), either directly or indirectly (such as through one or more conductive layers in between).

Referring to the method 700 of FIG. 7 (with specific example references to the structures of FIGS. 1-6), processing begins with forming 710 a front end of line (FEOL) circuit (such as FEOL circuit 110) of the IC, and depositing an insulator layer (such as lower insulator layer 215) over the FEOL circuit. The method 700 further includes forming 720 a recess (such as recess 320) in the insulator layer to route the interconnect feature, depositing 730 a diffusion barrier (such as diffusion barrier 330) into the recess, depositing 740 liner material (such as liner 540) onto the diffusion barrier, depositing 750 fill metal (such as core 350) onto the liner material to fill at least a portion of the remainder of the recess, depositing 760 cap material (such as cap 560) on the fill metal and possibly on the fill metal, and applying 770 heat to diffuse the cap material into the liner material to form a solid solution (such as solid solution liner 340). In some embodiments, the deposition 760 of the cap material includes selectively depositing 760 the cap material on the fill metal. In some such embodiments, the deposition 760 of the cap material further includes selectively depositing 760 the cap material on the liner material. In some embodiments, forming a nitride etch stop layer (such as via layer 450) over the cap material provides sufficient heat in its thermal budget to diffuse the cap material into the liner material and form the solid solution.

Referring to the method 800 of FIG. 8 (with specific example references to the structures of FIGS. 1-6), processing begins with forming 810 a front end of line (FEOL) circuit (such as FEOL circuit 110) including a transistor (such as transistor 115), and forming a back end of line (BEOL) circuit (such as BEOL circuit 120) on the FEOL circuit. The forming of the BEOL circuit includes forming an insulator layer (such as insulator layer 510) and forming an interconnect feature (such as first interconnect feature 240) such that the insulator layer includes at least a portion of the interconnect feature. The forming of the interconnect feature includes forming 820 a recess (such as recess 520) in the insulator layer, and lining the recess with a first layer (such as diffusion barrier 530), The forming of the interconnect feature further includes lining 830 the first layer with a second layer (such as liner 540), where the second layer includes a first metal (such as ruthenium). The forming of the interconnect feature further includes lining 840 the second layer with core material including copper, to create a core (such as core 550).

The forming of the interconnect feature further includes capping 850 the core and second layer with a capping member (such as cap 560), where the capping member includes a second metal (such as cobalt) different from the first metal. The forming of the interconnect feature further includes heating 860 the second layer and the capping member to diffuse the second metal from the capping member into the second layer. For example, in some embodiments, the diffusing of the second metal from the capping member into the second layer includes creating a solid solution (such as solid solution liner 570) in the second layer, where the solid solution includes the first metal and the second metal. In some embodiments, the heating of the second layer and the capping member includes forming an etch stop layer (such as via layer 220) on the capping member, where the etch stop layer includes a nitride (such as silicon nitride).

While the above example methods appear as a series of operations or stages, it is to be understood that there is no required order to the operations or stages unless specifically indicated.

Example System

Figure 9:
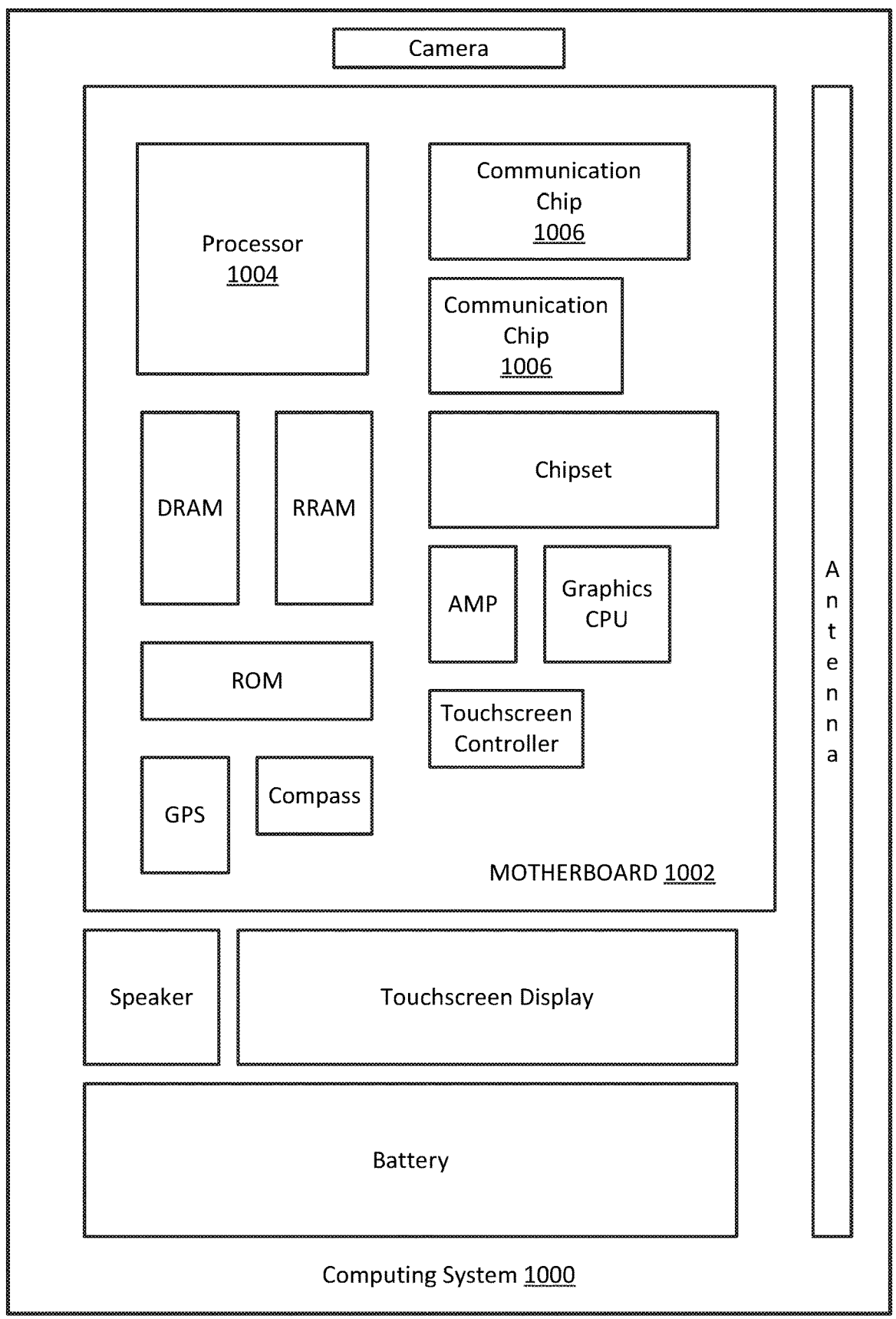
FIG. 9 illustrates an example computing system implemented with the integrated circuit structures or techniques disclosed herein, according to an embodiment of the present disclosure.

FIG. 9 illustrates an example computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including copper interconnect cladding as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., DRAM), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (including copper interconnect cladding) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like, that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., copper interconnect cladding) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., copper interconnect cladding) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., copper interconnect cladding) formed using the disclosed techniques, as variously described herein.

Further Example Embodiments

The following examples pertain to further embodiments, from which numerous permutations and configurations will be apparent.

Example 1 is an integrated circuit (IC) structure including: a front end of line (FEOL) circuit including a transistor; and a back end of line (BEOL) circuit above the FEOL circuit and including insulator material and an interconnect feature, the insulator material having at least a portion of the interconnect feature therein. The interconnect feature includes: a core containing copper; a first layer between the insulator material and the core, the first layer being distinct from the insulator material and the core; a second layer between the first layer and the core, the second layer being distinct from the first layer and the core, the second layer including a first metal and a second metal different from the first metal; and a capping member on the core and the second layer, the capping member including the second metal.

Example 2 includes the IC structure of Example 1, where the BEOL circuit further includes an etch stop layer on and contacting the capping member, the etch stop layer including nitrogen.

Example 3 includes the IC structure of any of Examples 1-2, where the first metal and the second metal are part of a solid solution in the second layer.

Example 4 includes the IC structure of any of Examples 1-2, where the second metal of the capping member is diffused into the first metal of the second layer, such that the second layer includes a solid solution that includes the first metal and the second metal.

Example 5 includes the IC structure of any of Examples 1-4, where the first metal is ruthenium and the second metal is cobalt.

Example 6 includes the IC structure of any of Examples 1-5, where the second metal has a higher concentration in the capping member than in the second layer.

Example 7 includes the IC structure of any of Examples 1-6, where the capping member further includes the first metal.

Example 8 includes the IC structure of Example 7, where the first metal has a higher concentration in the second layer than in the capping member.

Example 9 includes the IC structure of any of Examples 1-8, where the first and second metals include two transition metals that satisfy the Hume-Rothery rules for substitutional solid solutions.

Example 10 includes the IC structure of any of Examples 1-9, where the first metal and the second metal have the same crystal structure.

Example 11 includes the IC structure of any of Examples 1-10, where the first and second metals include two metals from molybdenum (Mo), tantalum (Ta), and tungsten (W), or two metals from rhodium (Rh), palladium (Pd), platinum (Pt), and gold (Au), or two metals from scandium (Sc), titanium (Ti), cobalt (Co), technetium (Tc), ruthenium (Ru), cadmium (Cd), rhenium (Re), and osmium (Os).

Example 12 includes the IC structure of any of Examples 1-11, where the first metal is a noble metal.

Example 13 includes the IC structure of Example 12, where the first metal includes one or more of ruthenium (Ru), rhodium (Rh), palladium (Pd), osmium (Os), platinum (Pt), and gold (Au).

Example 14 includes the IC structure of any of Examples 1-14, where the first layer includes tantalum (Ta).

Example 15 is a computing system including the IC structure of any of Examples 1-15.

Example 16 is a method of fabricating an integrated circuit (IC) structure, the method including: forming a front end of line (FEOL) circuit including a transistor; and forming a back end of line (BEOL) circuit on the FEOL circuit, the forming of the BEOL circuit including forming an insulator layer and forming an interconnect feature, the insulator layer having at least a portion of the interconnect feature therein. The forming of the interconnect feature includes: forming a recess in the insulator layer; lining the recess with a first layer; lining the first layer with a second layer, the second layer including a first metal; lining the second layer with core material including copper, to create a core; capping the core with a capping member, the capping member including a second metal different from the first metal; and heating the second layer and the capping member to diffuse the second metal from the capping member into the second layer.

Example 17 includes the method of Example 16, where the capping of the core includes capping the second layer with the capping member, and the diffusing of the second metal from the capping member into the second layer includes creating a solid solution in the second layer, the solid solution including the first metal and the second metal.

Example 18 includes the method of any of Examples 16-17, where the heating of the second layer and the capping member includes forming an etch stop layer on the capping member, the etch stop layer including nitrogen.

Example 19 includes the method of any of Examples 16-18, where the first metal is ruthenium and the second metal is cobalt.

Example 20 includes the method of any of Examples 16-19, where the first and second metals include two transition metals that satisfy the Hume-Rothery rules for substitutional solid solutions.

Example 21 includes the method of any of Examples 16-20, where the first metal and the second metal have the same crystal structure.

Example 22 includes the method of any of Examples 16-21, where the first and second metals include two metals from molybdenum (Mo), tantalum (Ta), and tungsten (W), or two metals from rhodium (Rh), palladium (Pd), platinum (Pt), and gold (Au), or two metals from scandium (Sc), titanium (Ti), cobalt (Co), technetium (Tc), ruthenium (Ru), cadmium (Cd), rhenium (Re), and osmium (Os).

Example 23 includes the method of any of Examples 16-22, where the first metal is a noble metal.

Example 24 includes the method of Example 23, where the first metal includes one or more of ruthenium (Ru), rhodium (Rh), palladium (Pd), osmium (Os), platinum (Pt), and gold (Au).

Example 25 includes the method of any of Examples 16-24, where the first layer includes tantalum (Ta).

Example 26 is a method of fabricating a computing system including fabricating the IC structure according to the method of any of Examples 16-25.

Example 27 is an integrated circuit (IC) structure including an interconnect feature associated with a first interconnect layer, the first interconnect layer including insulator material around at least a portion of the interconnect feature, the first interconnect layer being below a second interconnect layer, the interconnect feature including: a core including copper; a first layer between the insulator material and the core, the first layer being distinct from the core; a second layer between the first layer and the core, the second layer being distinct from the first layer and the core, the second layer including a first metal and a second metal different from the first metal; and a capping member on the core and the second layer, the capping member including the second metal.

Example 28 includes the IC structure of Example 27, where the first metal and the second metal are part of a solid solution in the second layer, the first metal and the second metal satisfying the Hume-Rothery rules for substitutional solid solutions.

Example 29 includes the IC structure of Example 27, where the second metal of the capping member is diffused into the first metal of the second layer, such that the second layer includes a solid solution that includes the first metal and the second metal.

Example 30 includes the IC structure of any of Examples 27-29, further including an etch stop layer separating the first and second interconnect layers, the etch stop layer contacting the capping member and including etch stop material containing nitrogen.

Example 31 includes the IC structure of Example 30, where the insulator material is first insulator material, the core is a first core, the capping member is a first capping member, the IC structure further includes a via associated with the etch stop layer and the second interconnect layer, the via being electrically connected to the first capping member, the etch stop material being around at least a portion of the via, the second interconnect layer including second insulator material around at least another portion of the via, the via including: a second core including copper; a third layer between the etch stop material and the second core, and between the second insulator material and the second core, the third layer being distinct from the etch stop material, the second insulator material, and the second core; a fourth layer between the third layer and the second core, the fourth layer being distinct from the third layer and the second core, the fourth layer including the first metal and the second metal; and a second capping member on the second core and the fourth layer, the second capping member including the second metal.

Example 32 includes the IC structure of any of Examples 27-31, where the first metal is ruthenium and the second metal is cobalt.

Example 33 includes the IC structure of any of Examples 27-32, where the second metal has a higher concentration in the capping member than in the second layer.

Example 34 includes the IC structure of any of Examples 27-33, where the capping member further includes the first metal.

Example 35 includes the IC structure of Example 34, where the first metal has a higher concentration in the second layer than in the capping member.

Example 36 includes the IC structure of any of Examples 27-35, where the first and second metals include two metals from molybdenum (Mo), tantalum (Ta), and tungsten (W), or two metals from rhodium (Rh), palladium (Pd), platinum (Pt), and gold (Au), or two metals from scandium (Sc), titanium (Ti), cobalt (Co), technetium (Tc), ruthenium (Ru), cadmium (Cd), rhenium (Re), and osmium (Os).

Example 37 includes the IC structure of any of Examples 27-36, where the first metal is a noble metal.

Example 38 includes the IC structure of Example 37, where the first metal includes one or more of ruthenium (Ru), rhodium (Rh), palladium (Pd), osmium (Os), platinum (Pt), and gold (Au).

Example 39 includes the IC structure of any of Examples 27-38, where the first layer includes tantalum (Ta).

Example 40 is a computing system including the IC structure of any of Examples 27-39.

Example 41 is a method of fabricating an interconnect feature in an integrated circuit (IC), the method including: forming a front end of line (FEOL) circuit of the IC; depositing an insulator layer over the FEOL circuit; forming a recess in the insulator layer to route the interconnect feature; depositing a diffusion barrier into the recess; depositing liner material onto the diffusion barrier; depositing fill metal onto the liner material to fill at least a portion of the remainder of the recess; depositing cap material on the fill metal; and applying heat to diffuse the cap material into the liner material to form a solid solution.

Example 42 includes the method of Example 41, where the fill metal includes copper, the diffusion barrier includes tantalum, the liner material includes ruthenium, and the cap material includes cobalt.

Example 43 includes the method of any of Examples 41-42, where the depositing of the cap material on the fill metal includes selectively depositing the cap material on the fill metal, and the applying of the heat comprises forming an etch stop layer on the cap material, the etch stop layer including nitrogen.

Example 44 includes the method of any of Examples 41-43, where the depositing of the cap metal on the fill metal includes depositing the cap material on the liner material, and the liner material and the cap material include two transition metals that satisfy the Hume-Rothery rules for substitutional solid solutions.

Example 45 includes the method of Example 44, where the depositing of the cap material on the fill metal further includes selectively depositing the cap material on the fill metal and the liner material.

Example 46 includes the method of any of Examples 41-45, where the liner material and the cap material include two metals from molybdenum (Mo), tantalum (Ta), and tungsten (W), or two metals from rhodium (Rh), palladium (Pd), platinum (Pt), and gold (Au), or two metals from scandium (Sc), titanium (Ti), cobalt (Co), technetium (Tc), ruthenium (Ru), cadmium (Cd), rhenium (Re), and osmium (Os).

Example 47 includes the method of any of Examples 41-46, where the liner material includes a noble metal.

Example 48 includes the method of Example 47, where the liner material includes one or more of ruthenium (Ru), rhodium (Rh), palladium (Pd), osmium (Os), platinum (Pt), and gold (Au).

Example 49 is a method of fabricating a computing system including fabricating the interconnect feature according to the method of any of Examples 41-48.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) structure comprising:
   a front end of line (FEOL) circuit including a transistor; and
   a back end of line (BEOL) circuit above the FEOL circuit and including insulator material and an interconnect feature, the insulator material having at least a portion of the interconnect feature therein, wherein the interconnect feature comprises a core including copper, a first layer between the insulator material and the core, the first layer being distinct from the insulator material and the core, a second layer between the first layer and the core, the second layer being distinct from the first layer and the core, the second layer including a first metal and a second metal different from the first metal, and a capping member on the core and the second layer, the capping member including the first metal and the second metal, wherein the second metal has a higher concentration in the capping member than in the second layer, and the first metal has a higher concentration in the second layer than in the capping member.

2. The IC structure of claim 1, wherein the BEOL circuit further comprises an etch stop layer on and contacting the capping member, the etch stop layer including nitrogen.

3. The IC structure of claim 1, wherein the first metal and the second metal are part of a solid solution in the second layer.

4. The IC structure of claim 1, wherein the second metal of the capping member is diffused into the first metal of the second layer, such that the second layer comprises a solid solution that includes the first metal and the second metal.

5. The IC structure of claim 1, wherein the first metal is ruthenium and the second metal is cobalt.

6. The IC structure of claim 1, wherein the first and second metals comprise two transition metals that satisfy the Hume-Rothery rules for substitutional solid solutions.

7. The IC structure of claim 1, wherein the first metal and the second metal have the same crystal structure, and the first and second metals comprise two metals from molybdenum (Mo), tantalum (Ta), and tungsten (W), or two metals from rhodium (Rh), palladium (Pd), platinum (Pt), and gold (Au), or two metals from scandium (Sc), titanium (Ti), cobalt (Co), technetium (Tc), ruthenium (Ru), cadmium (Cd), rhenium (Re), and osmium (Os).

8. The IC structure of claim 1, wherein the first metal is a noble metal, and the first metal comprises one or more of ruthenium (Ru), rhodium (Rh), palladium (Pd), osmium (Os), platinum (Pt), and gold (Au).

9. The IC structure of claim 1, wherein the first layer comprises tantalum (Ta).

10. An integrated circuit (IC) structure comprising an interconnect feature associated with a first interconnect layer, the first interconnect layer including insulator material around at least a portion of the interconnect feature, the first interconnect layer being below a second interconnect layer, the interconnect feature comprising:
a core including copper;
a first layer between the insulator material and the core, the first layer being distinct from the core;
a second layer between the first layer and the core, the second layer being distinct from the first layer and the core, the second layer including a first metal and a second metal different from the first metal; and
a capping member on the core and the second layer, the capping member including the first metal and the second metal, wherein the second metal has a higher concentration in the capping member than in the second layer, and the first metal has a higher concentration in the second layer than in the capping member.

11. The IC structure of claim 10, wherein the first metal and the second metal are part of a solid solution in the second layer, the first metal and the second metal satisfying the Hume-Rothery rules for substitutional solid solutions.

12. The IC structure of claim 10, wherein the second metal of the capping member is diffused into the first metal of the second layer, such that the second layer comprises a solid solution that includes the first metal and the second metal.

13. The IC structure of claim 10, further comprising an etch stop layer separating the first and second interconnect layers, the etch stop layer contacting the capping member and including etch stop material containing nitrogen.

14. The IC structure of claim 13, wherein the insulator material is first insulator material, the core is a first core, the capping member is a first capping member, the IC structure further comprises a via associated with the etch stop layer and the second interconnect layer, the via being electrically connected to the first capping member, the etch stop material being around at least a portion of the via, the second interconnect layer including second insulator material around at least another portion of the via, the via comprising:

a second core including copper;
a third layer between the etch stop material and the second core, and between the second insulator material and the second core, the third layer being distinct from the etch stop material, the second insulator material, and the second core;
a fourth layer between the third layer and the second core, the fourth layer being distinct from the third layer and the second core, the fourth layer including the first metal and the second metal; and
a second capping member on the second core and the fourth layer, the second capping member including the second metal.

15. An integrated circuit (IC) structure comprising:
a front end of line (FEOL) circuit including a transistor; and
a back end of line (BEOL) circuit above the FEOL circuit and including insulator material and an interconnect feature, the insulator material having at least a portion of the interconnect feature therein, wherein the interconnect feature comprises a core including copper, a first layer between the insulator material and the core, the first layer being distinct from the insulator material and the core, a second layer between the first layer and the core, the second layer being distinct from the first layer and the core, the second layer including a first metal and a second metal different from the first metal, and a capping member on the core and the second layer, the capping member including the second metal, wherein the second metal of the capping member is diffused into the first metal of the second layer, such that the second layer comprises a solid solution that includes the first metal and the second metal.

16. An integrated circuit (IC) structure comprising:
a front end of line (FEOL) circuit including a transistor; and
a back end of line (BEOL) circuit above the FEOL circuit and including insulator material and an interconnect feature, the insulator material having at least a portion of the interconnect feature therein, wherein the interconnect feature comprises a core including copper, a first layer between the insulator material and the core, the first layer being distinct from the insulator material and the core, a second layer between the first layer and the core, the second layer being distinct from the first layer and the core, the second layer including a first metal and a second metal different from the first metal, and a capping member on the core and the second layer, the capping member including the second metal, wherein the first and second metals comprise two transition metals that satisfy the Hume-Rothery rules for substitutional solid solutions.

* * * * *